United States Patent
Lin et al.

[19]

[11] Patent Number: 6,100,136
[45] Date of Patent: Aug. 8, 2000

[54] METHOD OF FABRICATING CAPACITOR CAPABLE OF MAINTAINING THE HEIGHT OF THE PERIPHERAL AREA OF THE CAPACITOR

[75] Inventors: Dahcheng Lin; Chih-Hsing Yu, both of Hsinchu, Taiwan

[73] Assignee: Worldwide Semiconductor Manufacturing Corp., Hsinchu, Taiwan

[21] Appl. No.: 09/342,718

[22] Filed: Jun. 29, 1999

[30]  Foreign Application Priority Data

May 6, 1999 [TW] Taiwan .................................. 88107368

[51] Int. Cl.$^7$ ................................................ H01L 21/8242
[52] U.S. Cl. .......................... 438/253; 438/254; 438/396; 438/397
[58] Field of Search ....................................... 257/300, 303, 257/304, 306, 532; 438/253, 254, 255, 256, 259, 396, 397, 398, 399, 239, 387, 393

[56]  References Cited

U.S. PATENT DOCUMENTS

| 5,488,011 | 1/1996 | Figura et al. | 438/253 |
| 5,650,351 | 7/1997 | Wu | 438/398 |
| 5,652,165 | 7/1997 | Lu et al. | 438/396 |
| 5,895,250 | 4/1999 | Wu | 438/396 |

*Primary Examiner*—Donald L. Monin, Jr.
*Assistant Examiner*—Hoai Pham
*Attorney, Agent, or Firm*—J.C. Patents; Jiawei Huang

[57]  ABSTRACT

A method of forming a capacitor. A substrate comprises a cell array area and a peripheral area. A dielectric layer is formed on the substrate. The covering layer is formed on the dielectric layer. The contact electrode is formed through the dielectric layer and the covering layer. The first oxide layer is formed over the substrate. A portion of the first oxide layer is removed to form an opening, which exposes the contact electrode. A conformal preserve layer is formed over the substrate. A second oxide layer is formed over the substrate. A portion of the second oxide layer in the cell array area is removed to form an opening, which exposes the contact electrode. A conformal first conductive layer is formed over the substrate to cover the second oxide layer and the opening. A third oxide layer is formed over the substrate to cover the first conductive layer and fill the opening. A planarization step is performed to remove the third oxide layer, the first conductive layer, and the second oxide layer until the preserve layer in the peripheral area is exposed. The third oxide layer and the second oxide layer in the cell array area are removed to expose conductive layer. A selective hemispherical grained silicon layer and a dielectric film are formed in sequence over the exposed conductive layer. A second conductive layer is formed over the substrate to fill the opening.

10 Claims, 6 Drawing Sheets

METHOD OF FABRICATING CAPACITOR CAPABLE OF MAINTAINING THE HEIGHT OF THE PERIPHERAL AREA OF THE CAPACITOR

CROSS-REFERENCE TO RELATED APPLICATION

This application claims the priority benefit of Taiwan application serial no. 88107368, filed May 6, 1999, the full disclosure of which is incorporated herein by reference.

BACKGROUND OF THE INVENTION

1. Field of the Invention

The present invention relates to a method for maintaining the height of a peripheral area. More particularly, the invention relates to a method of fabricating a dynamic random access memory (DRAM).

2. Description of the Related Art

Since the trend of semiconductor fabrication process is towards a linewidth of 0.25 micrometers, or below, it is particularly important to form a DRAM capacitor with an increased storage surface. Conventionally, a hemispherical grain (HSG) layer is formed on double sidewalls of a crown-shaped bottom electrode of a capacitor in order to increase the storage area of the capacitor. In a DRAM fabrication process with a linewidth of 0.21 micrometers or 0.18 micrometers, the HSG layer is commonly used. In order to form the HSG layer, the bottom electrode must be exposed before forming the HSG layer on the bottom electrode. Therefore, it is necessary to remove the oxide layer, which covers the bottom electrode, in a cell array area to expose the bottom electrode. Unfortunately, the oxide layer in a peripheral area of the same chip is also simultaneously removed. The undesirable removal of the oxide layer causes a height difference between the cell array area and the peripheral area. This, in turn, induces difficulties in the subsequent photolithographic step, such as difficulties in controlling the depth of focus (DOF).

FIGS. 1A through 1E are schematic, cross-sectional views showing a conventional method of fabricating a capacitor.

In FIG. 1A, a substrate 100 includes a cell array area 102 and a peripheral area 104. A dielectric layer 106 and a covering layer 108 are formed in sequence over the substrate 100. A contact electrode 110 is formed through the dielectric layer 106 and the covering layer 108 in the cell array area 102. A first oxide layer 112 is formed over the substrate 100. A portion of the first oxide layer 112 is removed to form an opening 114 in the cell array area 102. The opening 114 in the first oxide layer 112 exposes the contact electrode 110.

In FIG. 1B, a conformal amorphous silicon layer 116 is formed over the substrate 100. The amorphous silicon layer 116 covers the opening 114 and the first oxide layer 112.

In FIG. 1C, a second oxide layer 118 is formed over the substrate 100 to fill the opening 114. A chemical-mechanical polishing (CMP) step is performed until the first oxide layer 112 in the peripheral area 104 is exposed. The amorphous silicon layer 116 in the peripheral area 104 is completely removed. An amorphous silicon layer 116a, which remains from the amorphous silicon layer 116, is formed in the cell array area 102.

In FIG. 1D, the second oxide layer 118 is removed to expose the double sidewalls of the amorphous silicon layer 116a, which is crown shaped. A selective HSG layer 120 is formed on the amorphous silicon layer 116a. The HSG layer 120 and the amorphous silicon layer 116a together serve as a bottom electrode. A conformal dielectric film 122 is formed on the HSG layer 120. The dielectric film 122 comprises an oxide/a nitride/an oxide (ONO) layer and a nitride/an oxide (NO) layer. The dielectric film 122 serves as a dielectric layer and a capacitor.

In FIG. 1E, a conductive layer 124 is formed over the substrate 100. The conductive layer 124 serves as a top electrode of a capacitor. Because the amorphous silicon layer 116 and the HSG layer 120 are formed in the cell array area 102, after the conductive layer 124 is formed, the surface height of the cell array area 102 is higher than that of the peripheral area 104. The different heights of the cell array area 102 and the peripheral area 104 causes difficulties in deciding the depth of focus in a photolithographic step. That is, due to the height difference between the cell array area 102 and the peripheral area 104, it is difficult to select a preferred depth of focus. Therefore, the linewidth of the fabrication process may increase, and more seriously, it may be difficult to perform a photolithographic step. Thus, it is important to maintain the height of the peripheral area 104.

In order to maintain the height of the peripheral area 104, the conventional method forms a photoresist layer (not shown) to cover the first oxide layer 112 in the peripheral area 104. The photoresist layer prevents the first oxide layer 112 in the peripheral area 104 from being removed during the removal of the first oxide layer 112 in the cell array area 102, in order to reduce the height difference between the cell array area 102 and the peripheral area 104.

However, in this conventional method, it is difficult to control precisely the formation range of the photoresist layer. For example, the photoresist layer may be undesirably formed on the amorphous silicon layer 106 in the cell array area 102. Once the photoresist layer covers the amorphous silicon layer 106 in the cell array area 102, the oxide layer 112 in the cell array area 102 cannot be completely removed. The exposed surface area of the amorphous silicon layer 116 is decreased, and correspondingly, the formation of the HSG layer 120 is decreased. Thus, the surface area of the bottom electrode cannot be effectively increased.

Furthermore, the formation of the photoresist layer is sometimes insufficient to cover completely the first oxide layer 112 in the peripheral area 104. As a result, while removing the first oxide layer 112 and the second oxide layer 118 in the cell array area 102, the first oxide layer 112 in the peripheral area 104 is undesirably removed. Thus, the foregoing problem caused by the height difference still exists. In addition, another conventional method solves the foregoing problem by reserving a guard region (not shown) in the peripheral area 104. However, the guard region increases the range of the peripheral area 104. This, in turn, causes the integration of a chip to decrease.

SUMMARY OF THE INVENTION

The invention provides a method of forming a capacitor. A substrate comprises a cell array area and a peripheral area. A dielectric layer is formed on the substrate. A covering layer is formed on the dielectric layer. A contact electrode is formed through the dielectric layer and the covering layer. A first oxide layer is formed over the substrate. A portion of the first oxide layer is removed to form an opening, which exposes the contact electrode. A conformal preserve layer is formed over the substrate. A second oxide layer is formed over the substrate to cover the preserve layer and fill the opening. A portion of the second oxide layer in the cell array area is removed to form an opening, which exposes the contact electrode. A conformal first conductive layer is formed over the substrate to cover the second oxide layer and the opening. A third oxide layer is formed over the substrate to cover the first conductive layer and fill the opening. A planarization step is performed to remove the third oxide layer, the first conductive layer, and the second oxide layer until the preserve layer in the peripheral area is exposed, so as to form a planarized surface over the substrate. The third oxide layer and the second oxide layer in the cell array area are removed to expose conductive layer. A hemispherical grained silicon layer and a dielectric film are formed in sequence over the exposed conductive layer. A second conductive layer is formed over the substrate to fill the opening.

In the invention, the preserve layer serves as a polishing stop layer. The first oxide layer in the peripheral area thus is not removed in the planarization step. The height of the peripheral area and the cell array area are substantially the same after the planarization step.

Moreover, Awhile removing the second oxide layer and the third oxide layer to expose the double sidewalls of first conductive layer, the preserve layer protects the first oxide layer in the peripheral area from erosion by a DHF solution or a HF vapor. In addition, it is unnecessary to form a guard region in the invention. Thus, the integration of the devices is not affected. Since no complex step is used in the present invention, the present invention can easily obtain a peripheral area and a cell array area with equal heights. Hence, the depth of the focus in the photolithography process is controlled.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
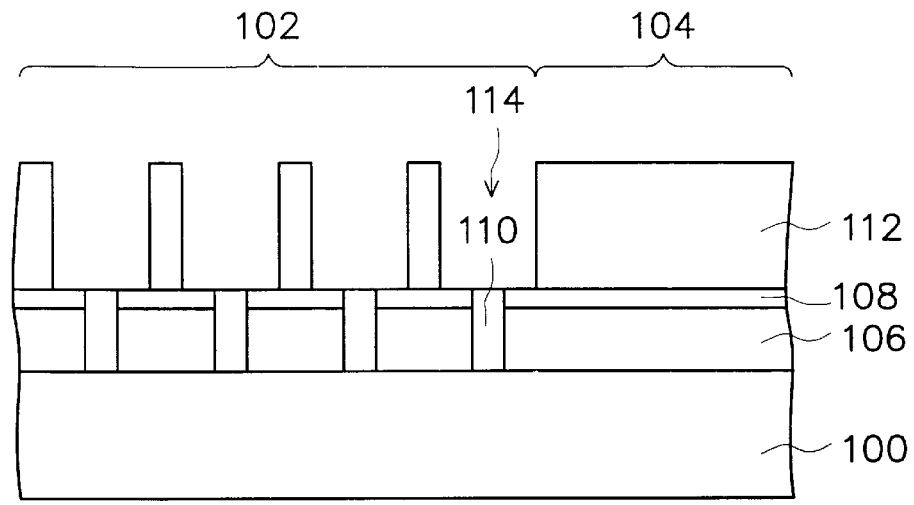
FIGS. 1A through 1E are schematic, cross-sectional views showing a conventional method of fabricating a capacitor.
Figure 1B:
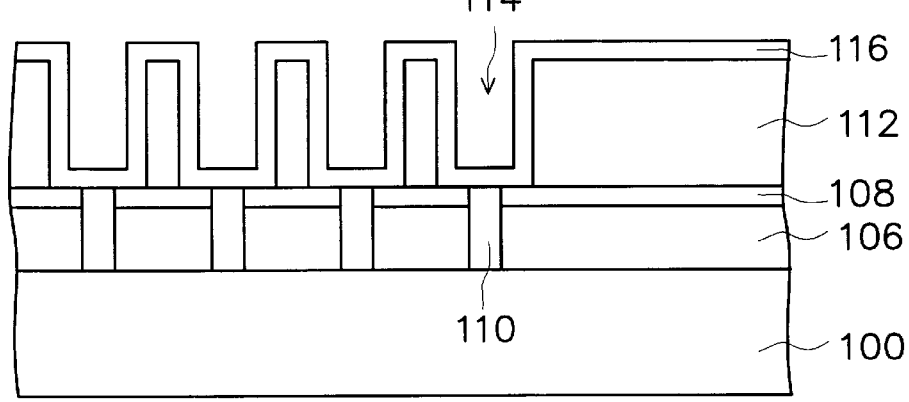
Figure 1C:
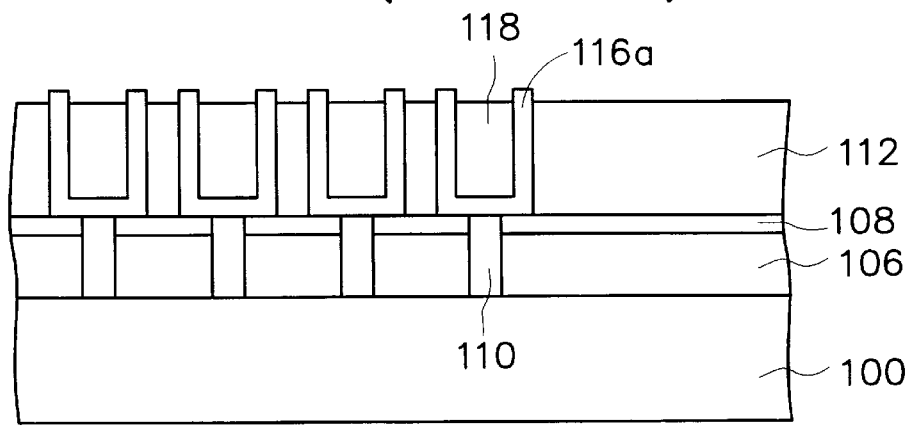
Figure 1D:
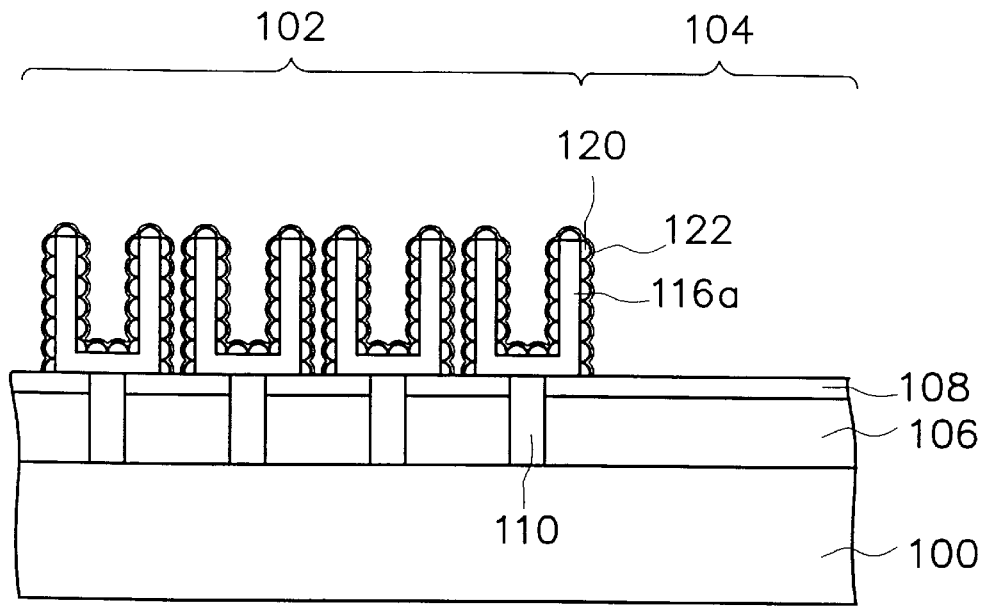
Figure 1E:
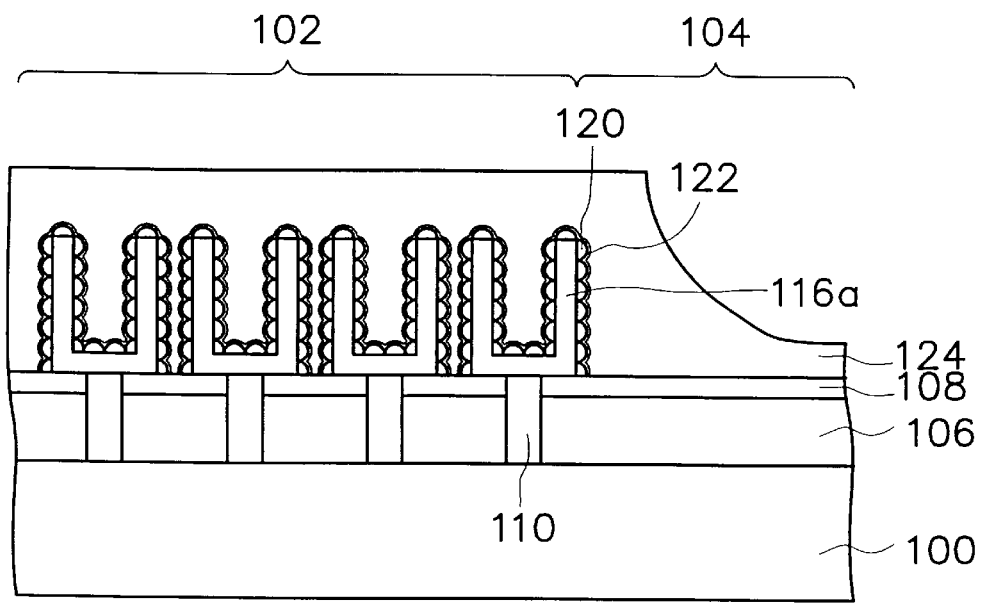

Reference will now be made in detail to the present preferred embodiments of the invention, examples of which are illustrated in the accompanying drawings. Wherever possible, the same reference numbers are used in the drawings and the description to refer to the same or like parts.

Figure 2A:
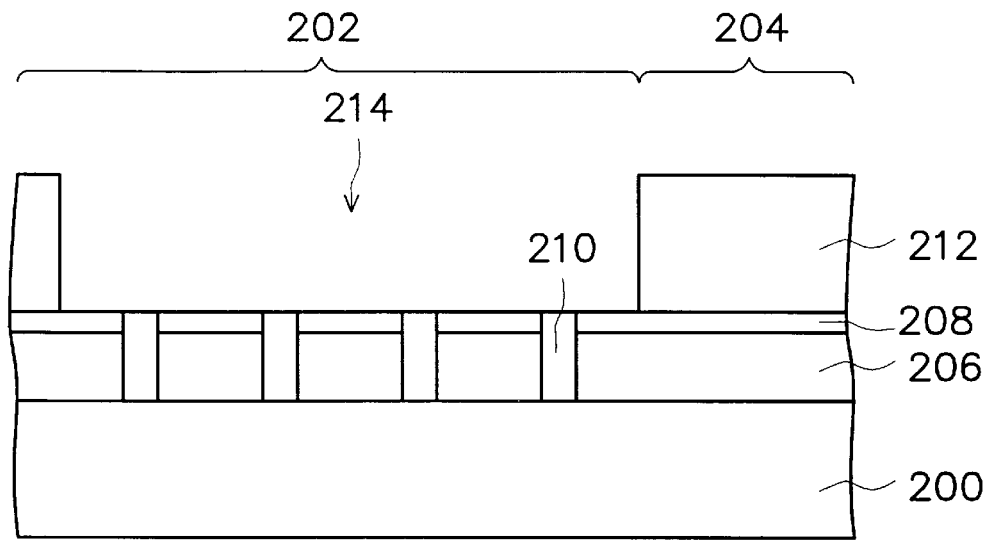
FIGS. 2A through 2G are schematic, cross-sectional views showing a method of fabricating a capacitor according to one preferred embodiment of the invention.

In FIG. 2A, a substrate 200 comprises a cell array region 202 and a peripheral area 204. A dielectric layer 206 is formed on the substrate 200. A covering layer 208 is formed on the dielectric layer 206 the substrate 200. A contact electrode 210 is formed through the dielectric layer 206 and the covering layer 208. Typically, the contact electrode 210 is electrically coupled with a source/drain region (not shown) in the substrate 100. A first oxide layer 212 is formed over the substrate 200. A portion of the first oxide layer 212 is removed to form an opening 214 through the first oxide layer 212 in the cell array area 202. The opening 214 exposes the contact electrode 210. The material of the dielectric layer 206 comprises oxide. The material of the covering layer 208 comprises nitride. The material of the contact electrode 210 comprises polysilicon. The thickness of the first oxide layer 212 is preferably about 5000 angstroms to about 10000 angstroms.

Figure 2B:
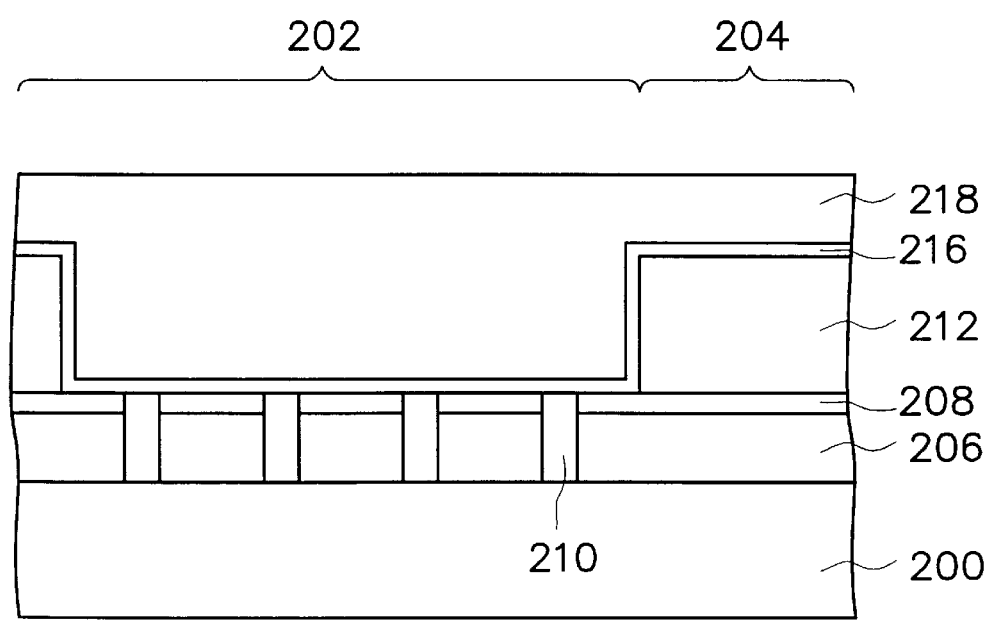

In FIG. 2B, to the advantage of maintaining the height of the peripheral area 204, a conformal preserve layer 216 is formed over the substrate 200 to cover the first oxide layer 212. A second oxide layer 218 is formed over the substrate 200 to cover the preserve layer 216 and fill the opening 214. The material of the preserve layer 216 comprises nitride. The thickness of the preserve layer 216 is about 200 angstroms to about 1500 angstroms. The thickness of the second oxide layer 218 is about 9000 angstroms to about 15000 angstroms.

Figure 2C:
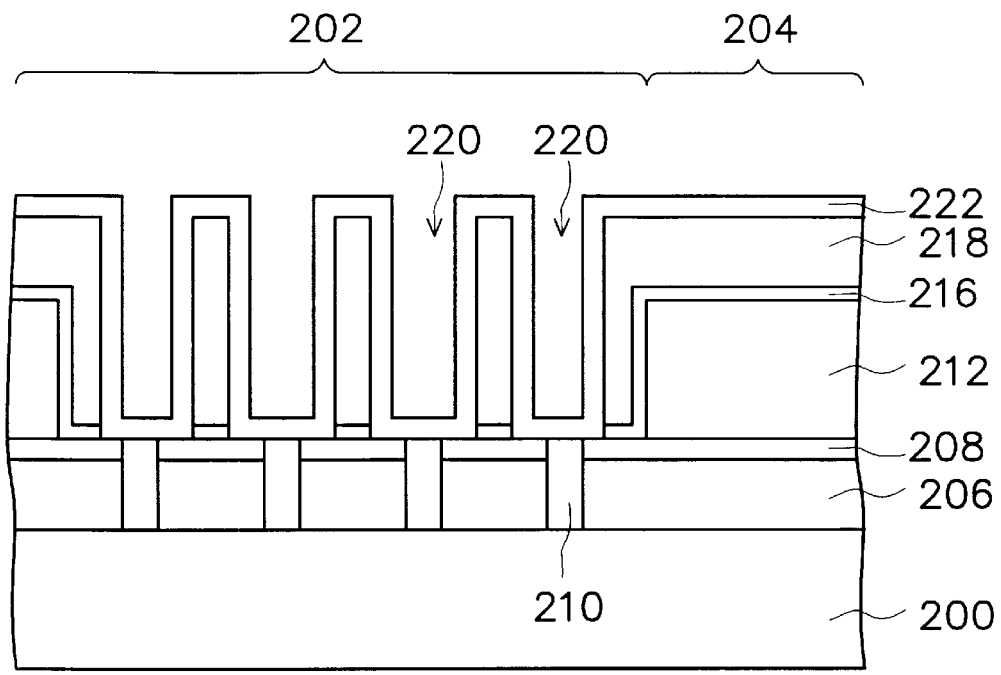

In FIG. 2C, a portion of the second oxide layer 218 and the preserve layer 216 are removed by, for example, photolithography and etching. An opening 220 is formed in the cell array area 202 to exposes the contact electrode 210. A conformal first conductive layer 222 is formed over the substrate 200 to cover the second oxide layer 218 and the opening 220. The material of the first conductive layer 222 is preferably amorphous silicon. The thickness of the first conductive layer 222 is preferably about 300 angstroms to about 1000 angstroms.

Figure 2D:
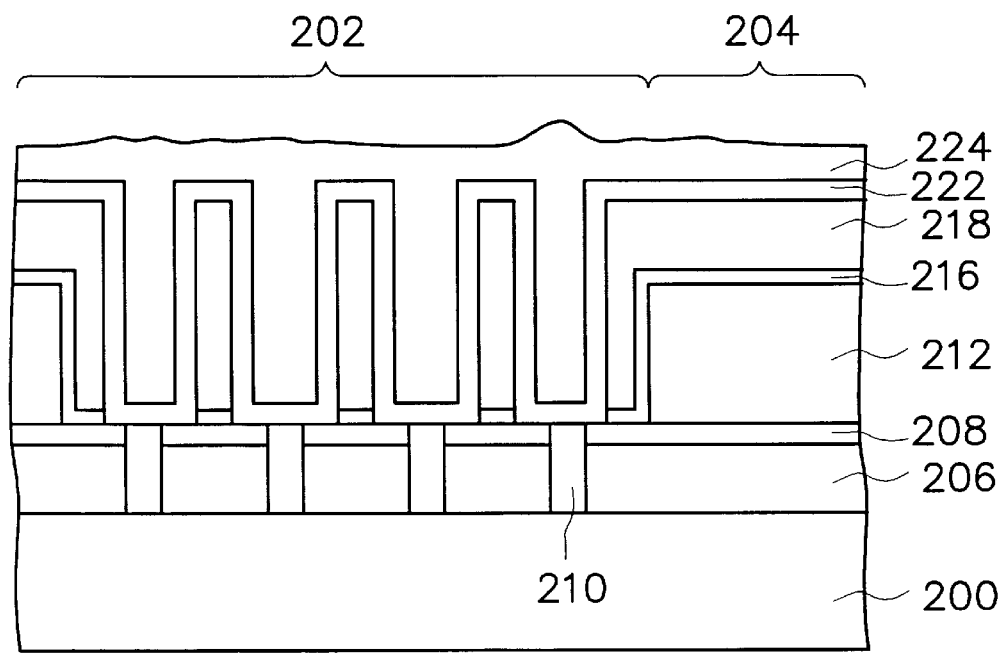

In FIG. 2D, a third oxide layer 224 is formed over the substrate 200 to cover the first conductive layer 222 and fill the opening 220.

Figure 2E:
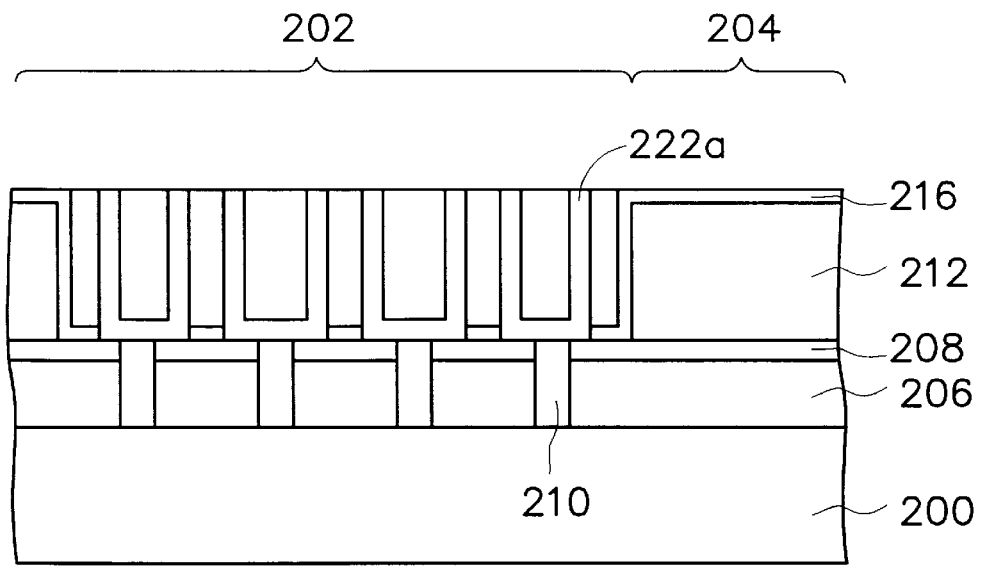

In FIG. 2E, a planarization step such as chemical-mechanical polishing is performed. The third oxide layer 224, the first conductive layer 222, and the second oxide layer 218 are removed until the preserve layer 216 in the peripheral area 204 is exposed. A first conductive layer 222a, which remains from the first conductive layer 222, is formed. In the planarization step, the preserve layer 216 prevents the first oxide layer 212 from being removed. Thus, after the planarization step, the heights the cell array area 202 and the peripheral area 204 are substantially the same.

Figure 2F:
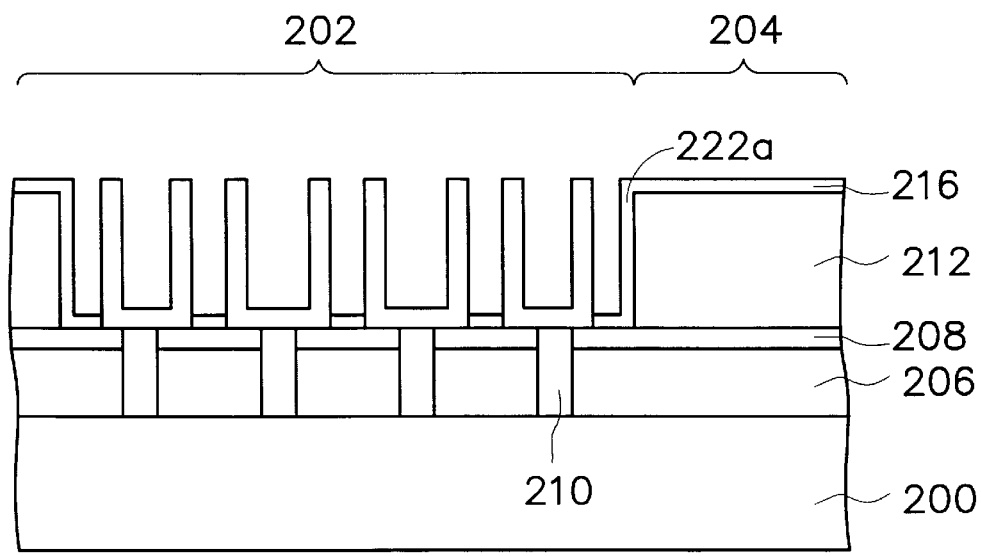

In FIG. 2F, the second oxide layer 218 and the third oxide layer 224 in the cell array area 202 are removed. The double sidewalls of the first conductive layer 222a are exposed. The second oxide layer 218 and the third oxide layer 224 can be removed in an environment of dilute HF (DHF) solution or HF vapor.

Figure 2G:
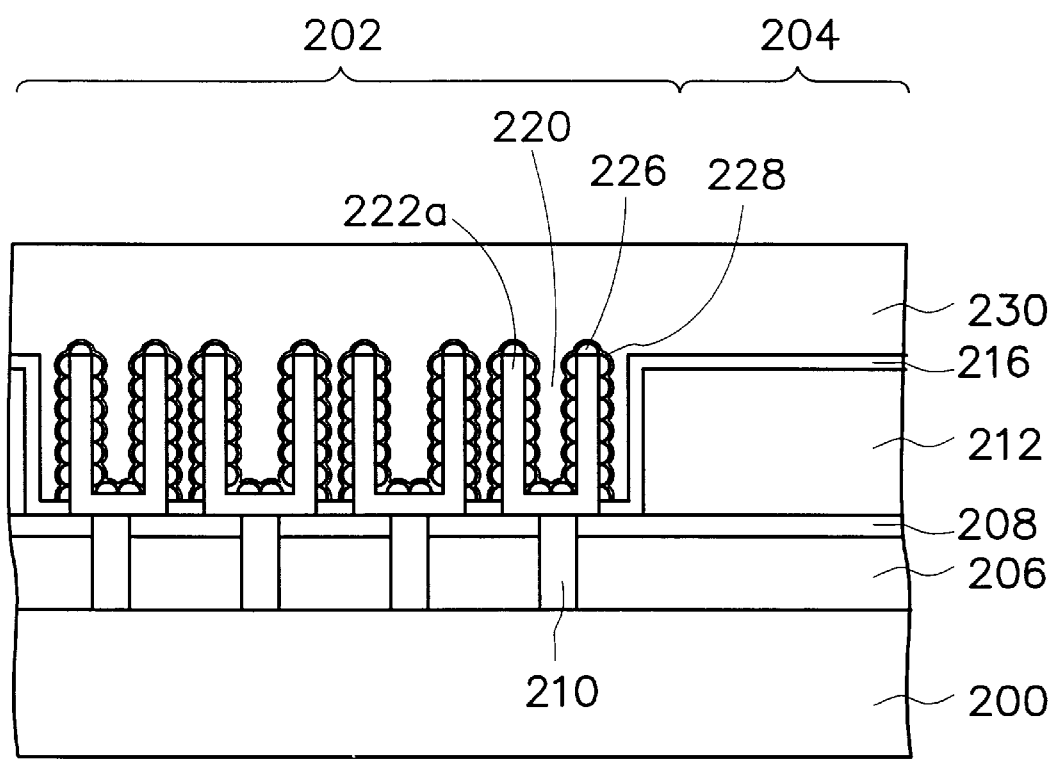

In FIG. 2G, an HSG layer 226 is selectively formed on the exposed first conductive layer 222a in the cell array area 202. The HSG layer 226 and the first conductive layer 222a together serve as a bottom electrode. The HSG layer 226 is used to increase the surface area of the bottom electrode of a capacitor. A dielectric film 228 is formed on the HSG layer 226. The dielectric film 228 comprises an oxide layer/a nitride layer/an oxide layer and a nitride layer/an oxide layer. The dielectric film 228 serves as a dielectric layer and a capacitor. A second conductive layer 230 is formed over the substrate to fill the opening 220. The second conductive layer 230 is used to serves as a top electrode of the capacitor.

In summary, the invention includes at least the following advantages:

1. The present invention forms a preserve layer 216 to prevent the first oxide layer 212 in the peripheral area 204 from being removed. During the planarization process, because the materials of the preserve layer 216 and the second oxide layer 218 different, the preserve layer 216 serves as a polishing stop layer. In this manner, the first oxide layer 212 in the peripheral area 204 is preserved, even after the planarization step. Thus, the height of the peripheral area 204 and the cell array area 202 are substantially the same.

2. While removing the second oxide layer 218 and the third oxide layer 224 to expose the double sidewalls of first conductive layer 222a, the preserve layer 216 protects the first oxide layer 212 in the peripheral area 204 from erosion by a DHF solution or a HF vapor.

3. The guard region is unnecessary in the invention. Thus, the integration of the devices is not affected. Since no complex step is used in the present invention, the present invention can easily obtain the peripheral area 204 and the cell array area 202 with equal heights. Hence, the depth of the focus in the photolithography process can be controlled.

It will be apparent to those skilled in the art that various modifications and variations can be made to the structure and the method of the present invention without departing from the scope or spirit of the invention. In view of the foregoing, it is intended that the present invention cover modifications and variations of this invention provided they fall within the scope of the following claims and their equivalents.

What is claimed is:

1. A method of forming a capacitor, comprising the steps of:

forming a dielectric layer on a substrate, wherein the substrate comprises a cell array area and a peripheral area;

forming a covering layer on the dielectric layer;

forming at least a contact electrode through the dielectric layer and the covering layer to contact the substrate;

forming a first oxide layer over the substrate;

removing a portion of the first oxide layer in the cell array area to form an opening, which exposes the contact electrode;

forming a conformal preserve layer over the substrate to cover the first oxide layer and a surface of the opening;

forming a second oxide layer over the substrate to cover the preserve layer and fill the opening;

removing a portion of the second oxide layer in the cell array area to form an opening, which exposes the contact electrode;

forming a conformal first conductive layer over the substrate to cover the second oxide layer and the opening;

forming a third oxide layer over the substrate to cover the first conductive layer and fill the opening;

performing a planarization step to remove the third oxide layer, the first conductive layer, and the second oxide layer until the preserve layer in the peripheral area is exposed, so as to form a planarized surface over the substrate;

removing the third oxide layer and the second oxide layer in the cell array area to expose the first conductive layer;

forming a hemispherical grained silicon layer on the exposed first conductive layer; and forming a dielectric film on the hemispherical grained silicon layer; and forming a second conductive layer over the substrate to fill the opening.

2. The method of claim 1, wherein the planarization step comprises chemical-mechanical polishing.

3. The method of claim 1, wherein the opening is formed in an environment of diluted HF vapor.

4. The method of claim 1, wherein the opening is formed in an environment of HF vapor.

5. The method of claim 1, wherein a material of the preserve layer comprises nitride.

6. The method of claim 1, wherein the preserve layer is about 200 angstroms to about 1500 angstroms thick.

7. The method of claim 1, wherein a material of the first conductive layer comprises amorphous silicon.

8. The method of claim 1, wherein the first conductive layer is about 300 angstroms to about 1000 angstroms thick.

9. The method of claim 1, wherein the dielectric film comprises an oxide layer/a nitride layer/an oxide layer.

10. The method of claim 1, wherein the dielectric film comprises a nitride layer/an oxide layer.

* * * * *